US00RE43442E

(19) United States
(12) Reissued Patent
Hayashi et al.

(10) Patent Number: US RE43,442 E
(45) Date of Reissued Patent: Jun. 5, 2012

(54) LIGHT-EMITTING DEVICE AND ELECTRONIC APPARATUS

(75) Inventors: Kenji Hayashi, Suwa (JP); Yukio Yamauchi, Chino (JP)

(73) Assignee: Seiko Epson Corporation, Tokyo (JP)

(21) Appl. No.: 13/115,371

(22) Filed: May 25, 2011

Related U.S. Patent Documents

Reissue of:
(64) Patent No.: 7,538,354
Issued: May 26, 2009
Appl. No.: 11/531,550
Filed: Sep. 13, 2006

(30) Foreign Application Priority Data

Nov. 22, 2005 (JP) ..... 2005-336650

(51) Int. Cl.
*H01L 51/50* (2006.01)
*H01L 33/04* (2006.01)

(52) U.S. Cl. ..... 257/79; 257/40; 257/72; 257/88; 257/E25.019; 257/E27.111; 257/E33.001; 257/E33.075; 313/504; 313/506; 313/509; 313/512; 438/30; 438/31

(58) Field of Classification Search ..... 257/40, 257/72, 79, 88, E25.019, E27.111, E33.001, 257/E33.075; 313/504, 506, 509, 512; 438/30, 438/31
See application file for complete search history.

(56) References Cited

U.S. PATENT DOCUMENTS 7,109,653 B2 * 9/2006 Imamura ..... 313/512
2002/0048829 A1 4/2002 Yamazaki et al.
2003/0017297 A1 1/2003 Song et al.
2003/0085654 A1 * 5/2003 Hayashi ..... 313/506
2003/0164674 A1 9/2003 Imamura
2003/0209708 A1 11/2003 Kubota
2004/0066137 A1 * 4/2004 Hayashi ..... 313/506
2004/0212759 A1 10/2004 Hayashi
2005/0084214 A1 4/2005 Hayashi et al.
2005/0110020 A1 * 5/2005 Hayashi et al. ..... 257/72
2005/0242720 A1 11/2005 Sano et al.

FOREIGN PATENT DOCUMENTS

JP A 9-185994 7/1997

(Continued)

OTHER PUBLICATIONS

European Search Report dated Aug. 2, 2011 for European Patent Application No. EP 06 02 3619.

*Primary Examiner* — Dao H Nguyen
(74) *Attorney, Agent, or Firm* — Oliff & Berridge, PLC

(57) ABSTRACT

A light-emitting device includes: a plurality of light-emitting elements each of which has an anode, a thin organic light-emitting layer, and a cathode sequentially stacked on a substrate and emits light by excitation due to an electric field, the anode being separated from another anode by an insulating pixel partition wall; an organic buffer layer that is formed of an organic compound, covers an area larger than a region where the plurality of light-emitting elements are formed, has a step difference smaller than that of an upper surface of the cathode on the substrate, and is approximately flat; and first and second gas barrier layers that are formed of an inorganic compound, are disposed on an outer surface of the organic buffer layer, and protect the plurality of light-emitting elements against air. Only one of the first and second gas barrier layers is adjacent to an upper surface of an insulating layer formed of an inorganic compound on the substrate so as to cover an area larger than that of the organic buffer layer.

9 Claims, 5 Drawing Sheets

FOREIGN PATENT DOCUMENTS

| | | |
|---|---|---|
| JP | A 2000-223264 | 8/2000 |
| JP | A 2001-284041 | 10/2001 |
| JP | A 2003-17244 | 1/2003 |
| JP | A-2004-127606 | 4/2004 |
| JP | A 2005-100943 | 4/2005 |
| JP | A 2006-24421 | 1/2006 |

* cited by examiner

LIGHT-EMITTING DEVICE AND ELECTRONIC APPARATUS

Matter enclosed in heavy brackets [ ] appears in the original patent but forms no part of this reissue specification; matter printed in italics indicates the additions made by reissue.

CROSS-REFERENCE TO RELATED APPLICATION

This application claims priority to Japanese Application No. 2005-336650, filed in Japan on Nov. 22, 2005, the entire disclosure of which is hereby incorporated by reference in its entirety.

BACKGROUND

The present invention relates to a technique of sealing light-emitting elements with a thin film.

As an example of known light-emitting elements, there is an organic EL (electroluminescent) element that emits light by using a light-emitting element having a thin organic light-emitting film composed of a multi-layered organic compound that is interposed between two electrodes and emits light by excitation due to an electric field. In a process of manufacturing a device having organic EL elements, in order to prevent an organic light-emitting material and a cathode, which includes an electron injection layer formed of, for example, calcium, magnesium, or aluminum complex, from deteriorating due to the presence of or contact with air or moisture, a sealing process is performed. As examples of known sealing techniques, thin film sealing techniques of covering organic EL elements with an extremely thin inorganic compound film are known (see, for example, JP-A-9-185994, JP-A-2001-284041, JP-A-2000-223264, and JP-A-2003-177244). In these techniques, the inorganic compound film serves as a gas barrier layer that blocks air.

In general, it is necessary to form a gas barrier layer with a large thickness in order that the gas barrier layer provides a sufficient reliability (in particular, coating reliability with respect to fine contamination that cannot be blocked even in a clean room). On the other hand, in the thin film sealing techniques, organic EL elements are formed on a substrate and a thin gas barrier layer is formed on the substrate so as to cover the organic EL elements by means of a vapor growth method, for example. At this time, a step difference, such as unevenness, may occur on a surface of the gas barrier layer, due to the presence of insulating pixel partition walls for separation among a plurality of elements. When the gas barrier layer having the step difference is formed to be uniformly thick, the stress is noticeably concentrated in a portion having the step difference, which causes the gas barrier layer to easily crack or be peeled off. Further, in the case where a gas barrier layer is a transparent and high moisture-resistance inorganic compound layer, which is formed of, for example, a silicon compound, the inorganic compound layer has a density and elastic modulus (Young's modulus) higher than those of an organic compound layer. Accordingly, a crack easily occurs due to the stress concentration.

If the gas barrier layer cracks or is peeled off, moisture contained in atmospheric air permeates into the organic EL elements. Accordingly, a problem occurs in that the organic EL elements are significantly deteriorated. Further, when the gas barrier layer is formed of an organic compound material having a low elastic modulus in order to prevent formation of cracks or is formed to be extremely thin, it is difficult to obtain sufficient sealing reliability even if the gas barrier layer does not crack or is not peeled off, which also causes early deterioration of the organic EL elements.

SUMMARY

An advantage of some aspects of the invention is that it provides a light-emitting device, in which light-emitting elements can be sufficiently sealed with a gas barrier layer that is not easily cracked or peeled off, and an electronic apparatus.

According to an aspect of the invention, a light-emitting device includes: a plurality of light-emitting elements each of which has an anode, a thin organic light-emitting layer, and a cathode sequentially stacked on a substrate and emits light by excitation due to an electric field, the anode being separated from another anode by an insulating pixel partition wall; an organic buffer layer that is formed of an organic compound, covers an area larger than a region where the plurality of light-emitting elements are formed, has a step difference smaller than that of an upper surface of the cathode on the substrate, and is approximately flat; and first and second gas barrier layers that are formed of an inorganic compound, are disposed on an outer surface of the organic buffer layer, and protect the plurality of light-emitting elements against air. Only one of the first and second gas barrier layers is adjacent to an upper surface of an insulating layer formed of an inorganic compound on the substrate so as to cover an area larger than that of the organic buffer layer. The organic compound is a compound having a skeleton composed of carbon as a basic structure.

In the light-emitting device, since the plurality of light-emitting elements are disposed according to the insulating pixel partition walls and the plurality of anodes interposed between the insulating pixel partition walls, large step difference occurs on the surface of the cathode formed on the organic light-emitting layer. However, since the organic buffer layer approximately planarizes the unevenness, such that the step difference at the upper surface of the organic buffer layer becomes smaller than that at the upper surface of the cathode. Therefore, as compared with a case in which the organic buffer layer is not provided, the gas barrier layer becomes further planarized on the plurality of light-emitting elements. As a result, the stress in the gas barrier layer becomes low, which makes it difficult that the gas barrier layer cracks easily.

Further, on the substrate, since the end portions of the organic buffer layer that is approximately planarized are angled much, the gas barrier layer located at the end portions of the organic buffer layer also cracks easily. For this reason, since the light-emitting element region approximately planarized by the organic buffer layer needs to be very reliably sealed, the first gas barrier layer and the second gas barrier layer are provided. Specifically, the light-emitting element region is coated with two gas barrier layers, and only end portions of the organic buffer layer to which stress is likely to be easily applied is coated with only one gas barrier layer. Thus, the stress is reduced, which can prevent the crack.

Furthermore, since the organic buffer layer is formed of an organic compound that is flexible and has low elastic modulus as compared with an inorganic compound, the stress can be easily dispersed.

As described above, according to the light-emitting device, it is possible to reliably seal the light-emitting elements with gas barrier layers that are not easily cracked or peeled off.

In the light-emitting device, preferably, the first gas barrier layer covers an area larger than that of the organic buffer layer, and the second gas barrier layer covers an area that is smaller than that of the organic buffer layer and larger than that of the region where the plurality of light-emitting elements are formed.

According to the light-emitting device, as compared with the case in which the organic buffer layer is not provided, the gas barrier layer becomes further planarized on the plurality of light-emitting elements. As a result, the gas barrier layer does not crack easily. Further, since the region where the plurality of light-emitting elements are formed is coated with the first and second gas barrier layers, the gas barrier layers are sufficiently thick, which makes it possible to reliably seal the plurality of light-emitting elements. In addition, since the second gas barrier layer is not provided around the end portions of the organic buffer layer, the thickness of the gas barrier layer around the end portions of the organic buffer layer is small. Therefore, even if the gas barrier layer around the end portions of the organic buffer layer is not flat, the gas barrier layer is not easily cracked or peeled off. In addition, since the organic buffer layer is formed of an organic compound having low elastic modulus in which the stress can be easily dispersed, the crack of the gas barrier layer becomes further difficult. As described above, according to the light-emitting device, it is possible to reliably seal the light-emitting elements with gas barrier layers that are not easily cracked or peeled off.

Further, in the light-emitting device, preferably, the second gas barrier layer is thicker than the first gas barrier layer.

According to the light-emitting device, since the sealing reliability with respect to the plurality of light-emitting elements is not largely affected, it is possible to make the first gas barrier layer relatively thin. As a result, it is possible to make it difficult that the gas barrier layers crack or are peeled off.

Furthermore, according to another aspect of the invention, a light-emitting device includes: a plurality of light-emitting elements each of which has an anode, a thin organic light-emitting layer, and a cathode sequentially stacked on a substrate and emits light by excitation due to an electric field, the anode being separated from another anode by an insulating pixel partition wall; an organic buffer layer that is formed of an organic compound, covers an area larger than that of a region where the plurality of light-emitting elements are formed, has a step difference smaller than a surface of the cathode on the substrate, and is approximately flat; and a gas barrier layer that is formed of an inorganic compound and covers the organic buffer layer in order to protect the plurality of light-emitting elements against air. In the gas barrier layer, a portion that covers the region where the plurality of light-emitting elements are formed is thicker than a peripheral portion that covers end portions of the organic buffer layer.

In the light-emitting device, since the plurality of light-emitting elements are disposed on the substrate with gaps therebetween, the step difference occurs on a first surface of the organic buffer layer that covers the plurality of light-emitting elements. However, in the organic buffer layer, the step difference on a second surface is smaller than that on the first surface. Accordingly, as compared with the case in which the organic buffer layer is not provided, the gas barrier layer becomes further planarized on the plurality of light-emitting elements. As a result, the gas barrier layer is not easily cracked or peeled off. Further, in the region where the plurality of light-emitting elements are formed, thick portions of the gas barrier layers overlap each other, the plurality of light-emitting elements can be reliably sealed. In addition, even if the gas barrier layers are not thin or flat, the gas barrier layers are not easily cracked or peeled off. In addition, since the organic buffer layer is formed of an organic compound in which the stress can be easily dispersed, the gas barrier layers are not easily cracked or peeled off even if the gas barrier layers are thick. As described above, according to the light-emitting device, it is possible to reliably seal the light-emitting elements with gas barrier layers that are not easily cracked or peeled off.

Further, in the light-emitting device, preferably, in the end portions of the organic buffer layer, an angle between an upper surface of the organic buffer layer and the upper surface of the substrate is 20° or less.

According to the light-emitting device, in a portion where the total thickness of the gas barrier layers is small, it is possible to make sufficiently small an angle by which the gas barrier layers are bent. As a result, the stress concentration in the gas barrier layers is suppressed, which makes it difficult that the gas barrier layers crack or are peeled off.

Furthermore, according to still another aspect of the invention, an electronic apparatus includes the above-described light-emitting device. In the light-emitting device, since it is possible to reliably seal the light-emitting elements with the gas barrier layers that are not easily cracked or peeled off, it is possible to suppress the light-emitting elements from deteriorating. Therefore, according to the electronic apparatus, it is easy to keep the display quality for a long time.

BRIEF DESCRIPTION OF THE DRAWINGS

The invention will be described with reference to the accompanying drawings, wherein like numbers reference like elements.

DETAILED DESCRIPTION OF EMBODIMENTS

Figure 1:
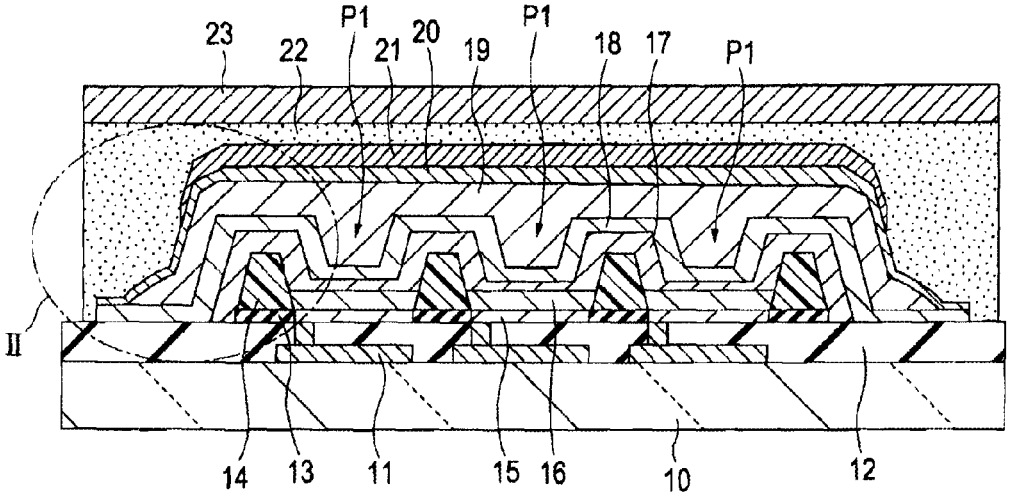
FIG. 1 is a cross-sectional view illustrating an organic EL panel according to a first embodiment of the invention.

Hereinafter, preferred embodiments of the invention will be described with reference to the accompanying drawings. Further, in order to make each layer and each member recognizable in the drawings, each layer and each member have been reduced using different scales. Furthermore, since FIGS. 1 to 4 illustrate cross-sectional views, hatching is omitted except for some parts. That is, only some parts shown in FIGS. 1 to 4 are hatched. In addition, in the following description, 'on' and 'below' are used with the plane of the drawings as a reference, and a 'thickness' of a layer refers to the length of the layer in the up/down direction of the plane of the drawings.

A: First embodiment

An organic EL panel (light-emitting device) according to a first embodiment of the invention is a full-color panel that uses a polymer-based organic EL material to be described later. In the organic EL panel, an organic EL element that emits red-colored light, an organic EL element that emits green-colored light, and an organic EL element that emits blue-colored light are disposed parallel to one another, such that full-color display can be performed. In addition, the organic EL panel is a top-emission-type panel in which light from an organic EL element is emitted from a side opposite to a main substrate.

A1: Configuration

Figure 2:
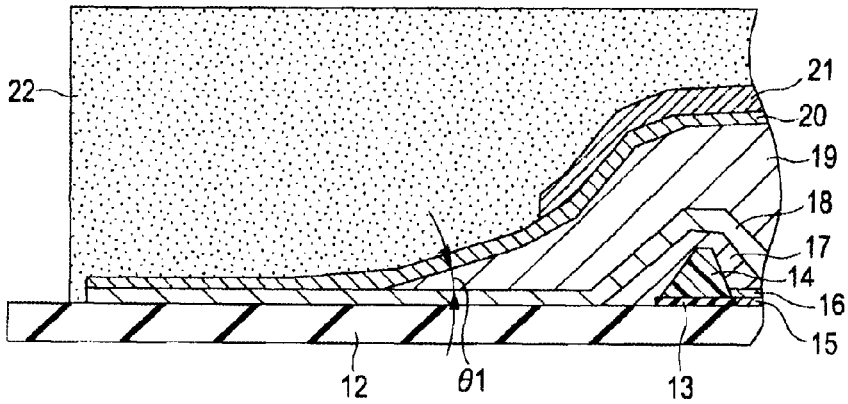
FIG. 2 is an enlarged cross-sectional view illustrating a part A shown in FIG. 1.

FIG. 1 is a cross-sectional view illustrating the organic EL panel, and FIG. 2 is an enlarged cross-sectional view illustrating a part A of the organic EL panel. The organic EL panel includes a plate-shaped main substrate 10. The main substrate 10 is formed of glass or plastic, and a plurality of organic EL elements P1 are formed on the main substrate 10. The organic EL element P1 has an organic light-emitting layer 16 formed of a polymer-based organic EL material, which will be described later, and is supplied with electrical energy so that light can be emitted therefrom (specifically, a light-emitting layer within the organic light-emitting layer 16). The organic EL elements P1 are classified into three kinds of organic EL element on the basis of the color of emitted light. The three kinds of organic EL element P1 are regularly arranged on the main substrate 10.

Further, a plurality of TFTs (thin film transistors) 11, which correspond to the plurality of organic EL elements P1 in one-to-one manner, and various wiring lines (only a part is shown) are formed on the main substrate 10. Each of the TFTs 11 is supplied with electrical energy and a control signal and drives the corresponding organic EL element P1. Specifically, the TFTs 11 supply a current to the organic EL elements P1 at timings at which the organic EL elements P1 sequentially emit light. In addition, the inorganic insulating layer 12 that covers the plurality of TFTs 11 is formed on the main substrate 10. The inorganic insulating layer 12 is provided to insulate the plurality of TFTs 11 and various wiring lines from one another and is formed of, for example, silicon compound.

On the inorganic insulating layer 12, a lyophilic bank layer (inorganic pixel partition wall insulation layer) 13 is formed of, for example, silicon dioxide in a layer thickness of 50 to 200 nm. On the lyophilic bank layer 13, a lyophobic bank layer (organic pixel partition wall insulation layer) 14 is formed of, for example, polyimide or acrylic resin in a layer thickness of 1 to 3 μm. The inorganic insulating layer 12, the lyophilic bank layer 13, and the lyophobic bank layer 14 define recessed portions, and the organic EL element P1 occupies a lower portion of each of the recessed portions. In the case of a light-emitting device and an electronic apparatus in which a single color is used, coating separation is not required, and accordingly, the organic light-emitting layer 16 may be formed over anodes 15 and the lyophilic bank layer 13 by means of a spin coating method or a slit coating method, as a structure in which the lyophobic bank layer 14 is not formed.

The organic EL element P1 has the anode 15 and a common cathode layer 17 with the organic light-emitting layer 16 interposed therebetween. The anode 15 and the common cathode layer 17 serve as electrodes through which holes and electrons are injected into the organic light-emitting layer 16, and an electric field is generated between the anode 15 and the common cathode layer 17 by means of electric energy supplied. The anode 15 is an electrode that has work function of 5 eV or more and is formed of, for example, ITO into which holes can be easily injected, and the anode 15 is connected to the corresponding TFT 11 by the wiring lines. The common cathode layer 17 is formed on the organic light-emitting layer 16 and the lyophobic bank layer 14 and serves as a common electrode with respect to the plurality of organic EL elements P1. For example, the common cathode layer 17 has an electron injection buffer layer, which is provided to make electrons easy to inject into the organic light-emitting layer 16, and a low-resistance layer that is formed on the electron injection buffer layer and is formed of a metal such as ITO or aluminum. The electron injection buffer layer is formed of, for example, lithium fluoride, calcium metal, or magnesium-silver alloy.

The organic light-emitting layer 16 includes a light-emitting layer that emits light by excitation due to recombination of holes and electrons injected by the electric field. Further, the organic light-emitting layer 16 may have a multi-layered structure including layers other than the light-emitting layer, and in this case, it is preferable that all layers be thin layers having a thickness of 300 nm or less in order to reduce an electrical resistance. The layers other than the light-emitting layer include a hole injection layer that is provided for easy injection of holes, a hole transport layer that is provided for easy transport of the injected holes to the light-emitting layer, an electron injection layer that is provided for easy injection of electrons, and an electron transport layer that is provided for easy transport of the injected electrons to the light-emitting layer, which contribute to the recombination of holes and electrons.

The light-emitting layer is formed of a polymer-based organic EL material. The polymer-based organic EL material is an organic compound having a relatively high molecular weight, among organic compounds that emit light by excitation due to recombination of holes and electrons. The polymer-based organic EL material forming the organic EL element P1 is formed of a material corresponding to the kind (color of emitted light) of the organic EL element P1. A material of a layer contributing to the recombination in the light-emitting layer is chosen according to a material of a layer adjacent to the layer contributing to the recombination in the light-emitting layer. When these materials are diluted with solvent and are then pattern-coated in an inkjet printing method or other printing methods, a surface of the lyophobic bank layer 14 repels a material of the organic light-emitting layer 16, and thus separate coating of colors is performed for each pixel. In the case of a single color in which the separate coating is not required, pixels can be separated from one another by forming the organic light-emitting layer 16 over the lyophilic bank layer 13 and the anodes 15 by means of a spin coating method or a slit coating method, without forming the lyophobic bank layer 14. The lyophilic bank layer 13 is formed up to ends of the anode 15, which is located at the lower portion of the recessed portion, and serves to stabilize the layer thickness of the organic light-emitting layer 16, and the organic light-emitting layer 16 is formed on the lyophilic bank layer 13. The lyophilic bank layer 13 is formed of, for example, silicon dioxide in a layer thickness of 50 to 200 nm.

Furthermore, a cathode protection layer 18 that covers the common cathode layer 17 is formed on the inorganic insulating layer 12 and the common cathode layer 17. In addition, in order to planarize unevenness due to pixels, an organic buffer layer 19 is formed on the cathode protection layer 18 so as to completely cover the plurality of organic EL elements P1. In addition, a first gas barrier layer 20, which completely covers the organic buffer layer 19 up to end portions of the organic buffer layer 19, is formed on the cathode protection layer 18 and the organic buffer layer 19 over an area larger than that of the organic buffer layer 19. On the first gas barrier layer 20, a second gas barrier layer 21 is formed over an area that is larger than that of the plurality of organic EL elements P1 and is smaller than that of the organic buffer layer 19.

The first gas barrier layer 20 and the second gas barrier layer 21 are formed of a material having excellent light transmittance, gas barrier property, and water resistance. As an example of such a material, a silicon compound containing nitrogen, such as silicon oxynitride, silicon nitride, or SiNH, may be preferably used. A high-density plasma film deposition method, such as sputtering, ion plating, or CVD (chemical vapor deposition), using ICP or ECR (electron cyclotron resonance) plasma or high-density plasma generated by a plasma gin may be used as a method of forming the gas barrier layer, and thus a high-density and high-quality thin film made of an inorganic compound can be formed at a low temperature. The first gas barrier layer 20 helps the organic buffer layer 19 and the plurality of organic EL elements P1 to be reliably sealed. The thickness of the first gas barrier layer 20 is within a range of 200 to 400 mm. The lower limit of the range is determined such that side surfaces of the organic buffer layer 19 or the neighborhood thereof are not insufficiently sealed. The second gas barrier layer 21 helps the plurality of organic EL elements P1 to be reliably sealed. The thickness of the second gas barrier layer 21 is within a range of 200 to 800 nm. Further, in the present embodiment, the thickness of the first gas barrier layer 20 and the thickness of the second gas barrier layer 21 are limited such that the sum of the thickness of the first gas barrier layer 20 and the thickness of the second gas barrier layer 21 is less than 1000 nm. The limitation is determined in consideration of the sealing reliability with respect to the plurality of organic EL elements P1, a possibility, that the gas barrier layer will crack or be peeled off, and a manufacturing cost.

The organic buffer layer 19 is provided to improve planarization and adhesion of the first gas barrier layer 20 and to relieve stress occurring in the first gas barrier layer 20, and the organic buffer layer 19 is formed by curing a material for an organic buffer layer (hereinafter, simply referred to as 'organic buffer layer material') which has viscosity and composition to be described later, in a low-pressure atmosphere. An upper surface of the organic buffer layer 19 that covers the plurality of organic EL elements P1 is flat. In each of the end portions of the organic buffer layer 19, an angle θ1 between the upper surface of the organic buffer layer 19 and an upper surface of the main substrate 10 is 20° or less. The thickness of the organic buffer layer 19, which covers the plurality of organic EL elements P1, excluding the vicinities of the end portions is within a range of 3 to 10 μm. The organic buffer layer 19 is formed by using a screen printing method. In the screen printing method, a mesh and a squeegee are used such that unevenness due to pixel partition walls can be solved by controlling the layer thickness. As a result, it is possible to planarize the upper surface of the organic buffer layer 19. The lower limit of the thickness of the organic buffer layer 19 is determined in consideration of the height of the pixel partition walls and the sealing reliability with respect to fine contamination that has adhered onto the substrate in previous processes. The upper limit of the thickness of the organic buffer layer 19 is determined such that the angle at each of the end portions of the organic buffer layer 19 is 20° or less and an amount of light, which leaks from a side surface of a surface protection substrate 23 or a side surface of an adhesion layer 22, which will be described later, without reaching an upper surface of the surface protection substrate 23, is not excessively high.

The cathode protection layer 18 is provided to protect the common cathode layer 17 and to improve the wettability and adhesion of the organic buffer layer 19 before the organic buffer layer 19 is cured, and the cathode protection layer 18 is formed of silicon compound, such as silicon oxynitride, having excellent light transmittance, adhesion, and water resistance. In particular, in the case where the common cathode layer 17 has a top emission structure, the layer thickness of the common cathode layer 17 is made small in consideration of transparency, which increases frequency of generation of pin holes, for example. For this reason, since a small amount of moisture, which is adhered while a material of the organic buffer layer 19 is being deposited until the organic buffer layer 19 is completely formed, and the material of the organic buffer layer 19 permeated into the organic light-emitting layer 16 causes the organic light-emitting layer 16 to be damaged and the damaged portion of the organic light-emitting layer 16 becomes a dark spot, the cathode protection layer 18 serves to prevent the damage. In addition, on the upper surface of the common cathode layer 17, unevenness exists due to the step difference between the lyophobic bank layer 14 and the organic EL element P1, which causes stress to be concentrated in the cathode protection layer 18. In order to prevent damage due to the stress concentration, the thickness of the cathode protection layer 18 is set to 200 mm or less.

Furthermore, on the main substrate 10, the adhesion layer 22 is formed to cover the inorganic insulating layer 12, the cathode protection layer 18, the first gas barrier layer 20, and the second gas barrier layer 21. The surface protection substrate 23 is provided on the adhesion layer 22 so as to completely cover the adhesion layer 22. The entire lower surface of the surface protection substrate 23 is adjacent to the adhesion layer 22. The adhesion layer 22 is provided for adhesion between the surface protection substrate 23 and the main substrate 10 and is formed of resin adhesive having excellent light transmittance. Examples of the resin adhesive include epoxy resin, acrylic resin, urethane resin, silicon resin, or the like. The surface protection substrate 23 is provided to improve optical characteristics and to protect the gas barrier layer and is formed of glass or plastic having excellent light transmittance. Examples of the plastic include polyethyleneterephthalate, acrylic resin, polycarbonate, polyolefin, or the like. In addition, the surface protection substrate 23 may have a function of a color filter, a function of blocking/absorbing ultraviolet rays, a function of preventing reflection of external light, or a function of heat dissipation using a fin.

A2: Manufacturing Process

In order to manufacture an organic EL panel according to the present embodiment, first, the TFTs 11, various wiring lines, and the inorganic insulating layer 12 are formed on the main substrate 10. Then, a reflective layer, which has a light-reflective property and is formed of, for example, an aluminum-copper alloy material, and transparent ITO are deposited on or below the inorganic insulating layer 12 by using a sputtering method, thereby forming the anodes 15 serving as a plurality of pixels. An upper surface of the anode 15 adjacent to the organic light-emitting layer 16 is preferably formed of ITO having a high work function in consideration of injection of holes. Accordingly, the TFTs 11 and the anodes 15 are connected to each other in one-to-one manner. Then, the lyophilic bank layer 13 is formed on the inorganic insulating layer 12 so as to surround the anodes 15. Then, the lyophobic bank layer 14, which is formed of an organic compound, such as polyimide or acrylic resin, is formed on the lyophilic bank layer 13. Then, a washing process, such as plasma washing, is performed to remove organic contamination from the main substrate and to improve the wettability of the ITO surface.

Thereafter, the organic light-emitting layer 16 is formed on the anodes 15. In this process, when a material of the organic light-emitting layer 16 is coated, the material spreads out to be flat adjacent to the lyophilic bank layer 13. Thus, the organic light-emitting layer 16 that is flat and has a uniform thickness is formed. In a process of forming the light-emitting layer included in the organic light-emitting layer 16, a polymer-based organic EL material used to form the organic light-emitting layer 16 that generates red-colored light is coated on the anode 15 which is to form the organic EL element P1 that generates the red-colored light. The same process as above is performed for the organic EL element P1 that generates green-colored light and the organic EL element P1 that generates blue-colored light. Furthermore, in the case of a single color, it takes a short time to perform a coating process if a spin coating method or a slit coating method is used. On the other hand, in the case of coating and separating three kinds of colored materials, it is preferable to perform pattern coating for each pixel by using an inkjet printing method or a screen printing method in terms of efficiency of use of materials. When the organic light-emitting layer 16 has a plurality of layers, the plurality of layers are sequentially formed.

Then, an electrode common to the plurality of organic EL elements P1, that is, the common cathode layer 17 is formed. For example, a metal or alloy into which electrons can be easily injected, such as lithium fluoride, calcium, or magnesium, is deposited by means of a vacuum deposition method using a heating boat (crucible). Then, in order to reduce the resistance of the common electrode, aluminum is deposited so as to avoid pixel units by means of the vacuum deposition method or transparent ITO is deposited at low-pressure atmosphere by means of a high-density plasma deposition method, such as an ECR plasma sputtering method, an ion plating method, or an opposite target sputtering method. Then, an oxygen plasma process is performed, and then the cathode protection layer 18, which is formed of silicon oxynitride, is formed so as to cover the common cathode layer 17 by means of the high-density plasma deposition method, such as the ECR plasma sputtering method or the ion plating method, in the same manner as for the ITO. Here, the oxygen plasma process is performed to improve the adhesion between the common cathode layer 17 and the cathode protection layer 18.

Subsequently, an organic buffer layer material having liquid form, which has viscosity of 2000 to 10000 mPa·s at room temperature (25° C.), is printed on the cathode protection layer 18 by using a screen printing method in a low-pressure atmosphere, nitrogen gas is introduced for the change to atmospheric pressure, and then the organic buffer layer material is carried to a curing chamber in which the organic buffer layer material corresponding to each substrate is heated at the temperature of 60 to 100° C. such that the organic buffer layer material is completely cured, thereby forming the organic buffer layer 19. The reason why the process of forming the organic buffer layer 19 is performed in the low-pressure atmosphere is to remove moisture and bubbles generated at the time of a coating process. That is, unlike in the process of forming the common cathode layer 17 or the cathode protection layer 18, while the organic buffer layer material is coated in a relatively low vacuum condition of 100 to 5000 Pa, the moisture is removed until a dew point reaches 60° C. or less by introducing nitrogen. In addition, the reason why the organic buffer layer material having a viscosity of 2000 mPa·s or more at room temperature is used is to avoid permeation of organic buffer layer material into the common cathode layer 17 or the organic light-emitting layer 16 through the cathode protection layer 18.

As a main component (for example, 70% or more by weight) of the organic buffer layer material, it is possible to use an organic compound which has good fluidity before being cured and does not have a volatile component such as solvent. In the present embodiment, an epoxy monomer (molecular weight of 3000 or less) that contains an epoxy group and has a molecular weight of 3000 or less/oligomer (molecular weight of 1000 to 3000) are used as the main component of the organic buffer layer material. Specifically, bisphenol A type epoxy oligomer or bisphenol F type epoxy oligomer, phenol novolac type epoxy oligomer, 3,4-epoxycyclohexenylmethyl-3',4'-epoxycyclohexenecarboxylate, caprolactone-modified 3,4-epoxycyclohexenylmethyl-3',4'-epoxycyclohexenecarboxylate or the like can be used alone or in combination.

As a sub-component of the organic buffer layer material, a curing agent that reacts with the epoxy monomer/oligomer may be used. In this case, it is preferable to use a curing agent capable of forming a cured layer that has a good insulation property, high heat resistance, and high strength. In addition, it is preferable to use an additive-polymerization-type curing agent having good light transmittance and small deviation in the cured state. Specifically, it is preferable to use an acid anhydride based curing agent formed of, for example, 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, 3,3',4,4'-benzophenonetetracarboxylic dianhydride, or a polymerized material thereof. The first reason why the acid anhydride based curing agent is preferably used is that the acid anhydride based curing agent is cured by heat treatment within the temperature range of 60 to 100 C and the cured layer becomes a polymer that has good adhesion with respect to silicon oxynitride and has an ester bond. The second reason is that the acid anhydride based curing agent can be cured at low temperature within a short period of time by adding a curing accelerator for accelerating the ring-opening of acid anhydride, such as aromatic amines, alcohols, and aminophenol, which have a relatively high molecular weight. The third reason is that it is difficult to cause the acid anhydride based curing agent to be easily damaged due to contraction when performing a rapid curing process, as compared with cation-emission-type photopolymerization initiator.

As other sub-components of the organic buffer layer material, additives, such as a silane coupling agent for improving the adhesion between the organic buffer layer 19 and the common cathode layer 17 or the first gas barrier layer 20, a water supplementing agent such as an isocyanate compound, and particles for preventing contraction when curing the organic buffer layer 19, are mixed in the organic buffer layer material.

The viscosity of each of the main component materials and the sub-component materials used in the present embodiment, before being cured, is preferably 1000 mPa·s or more at room temperature. This is to reduce a possibility that the materials will permeate into the organic light-emitting layer 16 before being cured. The viscosity of these materials should be determined in consideration of the reduction of the above possibility, whether the organic buffer layer 19 can be formed at the required pattern precision, whether the organic buffer layer 19 can be formed with a desired thickness, whether bubbles are not generated in the formed organic buffer layer 19, or the like.

Then, an oxygen plasma process is performed in the low-pressure atmosphere and a high-density plasma deposition method, such as the ECR sputtering method or the ion plating method, is performed such that the organic buffer layer 19 is completely covered up to end portions of the organic buffer layer 19 over an area larger than that of the organic buffer layer 19, thereby forming the first gas barrier layer 20. The reason why the oxygen plasma process is performed is to improve the adhesion between the organic buffer layer 19 and the first gas barrier layer 20. Then, by using a high-density plasma deposition method, such as the ECR sputtering method or the ion plating method, the second gas barrier layer 21 is formed on the first gas barrier layer 20 such that the plurality of organic EL elements P1 are covered and the end portions of the organic buffer layer 19 are not covered.

Thereafter, under atmospheric pressure, a resin adhesive having excellent light transmittance is coated to cover the inorganic insulating layer 12, the cathode protection layer 18, the first gas barrier layer 20, and the second gas barrier layer 21, the entire lower surface of the surface protection substrate 23 comes in contact with the resin adhesive, and the resin adhesive is cured, thereby forming the adhesion layer 22. Alternatively, an adhesive having liquid form may be used instead of the resin adhesive or a sheet-shaped adhesive may be interposed between the second gas barrier layer 21 and the surface protection substrate 23 and be then pressed therebetween.

A3: Effects

In the organic EL panel according to the present embodiment, on the plurality of organic EL elements P1, the uneven level of the upper surface of the organic buffer layer 19 is smaller than that of the upper surface of the cathode, that is, the upper surface of the organic buffer layer 19 is approximately flat. Therefore, as compared with a structure in which the organic buffer layer 19 is not provided, on the plurality of organic EL elements P1, the first gas barrier layer is further planarized and the stress concentration is suppressed, and accordingly, the gas barrier layer is not easily cracked or peeled off. Further, over the entire plurality of organic EL elements P1, since the first gas barrier layer 20 and the second gas barrier layer 21 overlap each other, the total thickness of the gas barrier layers is sufficiently large. As a result, the plurality of organic EL elements P1 can be reliably sealed. On the other hand, in portions of the first gas barrier layer 20 not overlapping the second gas barrier layer 21, the thickness of the gas barrier layer is small. However, since the end portions of the organic buffer layer 19 exist in the portions of the first gas barrier layer 90 not overlapping the second gas barrier layer 21, the gas barrier layer 20 is not easily cracked or peeled off even if unevenness is generated on a surface of the gas barrier layer. In addition, since the main component of the material for the organic buffer layer 19 is an organic compound, the stress can be easily buffered. Accordingly, it becomes more difficult for the gas barrier layer 20 to be easily cracked or peeled off. As such, according to the organic EL panel, the plurality of organic EL elements P1 can be sufficiently sealed by means of the gas barrier layers that are not easily cracked or peeled off. The stress that is buffered by the organic buffer layer 19 includes stress due to a force applied from the outside of the organic EL panel, stress due to expansion and contraction, which occur due to temperature variation, of the lyophobic bank layer 14 formed of an organic compound, or the like.

In the organic EL panel, the plurality of organic EL elements are required to be reliably sealed. For example, in the case when an organic light-emitting layer includes an electron injection layer, if moisture permeates into the electron injection layer of one of the organic EL elements, the moisture prohibits the organic EL element from emitting light, which may cause a so-called dark spot. Accordingly, in the organic EL panel according to the present embodiment, the total thickness of the gas barrier layers on the plurality of organic EL elements P1 is set to be large. Here, both the first gas barrier layer 20 and the second gas barrier layer 21 are not made thick, but only the second gas barrier layer 21 is made thick. As a result, according to the organic EL panel, it is possible to make the first gas barrier layer 20 so as to be not easily cracked or peeled off and to make the plurality of organic EL elements P1 reliably sealed, without making the first gas barrier layer 20 thick.

If the portions of the first gas barrier layer 20 not overlapping the second gas barrier layer 21 crack or are peeled off, the sealing reliability with respect to the plurality of organic EL elements P1 is noticeably reduced. Among the portions of the first gas barrier layer 20 not overlapping the second gas barrier layer 21, a portion, in which the first gas barrier layer 20 extends with the cathode protection layer 18 while being separated from the cathode protection layer 18, that is, the neighborhood of the end portions of the organic buffer layer 19 has a large bent angle. In the organic EL panel according to the present embodiment, the angle θ1 between the lower surface of the first gas barrier layer 20 and the upper surface of the main substrate 10 is 20° or less in the end portions of the organic buffer layer 19. Accordingly, it is possible to suppress the stress concentration in the gas barrier layer and to make the gas barrier layer so that it is not easily cracked or peeled off.

As described above, the gas barrier layer in the organic EL panel according to the present embodiment is not easily cracked or peeled off. As a result, since the sealing reliability with respect to the plurality of organic EL elements P1 can be kept high, the period of time for which the organic EL panel can reliably emit light becomes long. In order to support this, an experiment was performed in which various organic EL panels according to the present embodiment and other organic EL panels were exposed for 600 consecutive hours at the temperature of 60° C. and in an atmosphere with RH (relative humidity) of 90% and then the emission states of those organic EL panels were examined. Each of the organic EL panels used in this experiment has an organic buffer layer, which is formed of epoxy resin and has a thickness of 5 μm, and a gas barrier layer that is formed of silicon oxynitride and is formed over a large region so that end portions of the organic buffer layer are completely covered.

The result of the experiment is as follows. In the case of an organic EL panel having only one gas barrier layer having a thickness of 800 m, some of the plurality of organic EL elements close to a peripheral portion (end portions of the organic buffer layer) showed emission failure. Furthermore, in the case of an organic EL panel which has two gas barrier layers each having a thickness of 400 nm and in which a region on the main substrate overlapping a lower one of the gas barrier layers is the same as a region on the main substrate overlapping an upper one of the gas barrier layers, some of the plurality of organic EL elements located in the peripheral portion showed emission failure. In both the organic EL panels, the reason why the organic EL elements located in the peripheral portion showed the emission failure is that a gas barrier layer near a tapered portion of the organic buffer layer cracked or was peeled off so that moisture permeated into the organic EL elements.

On the other hand, like the organic EL panel according to the present embodiment, in the case of an organic EL, panel which has two gas barrier layers each having a thickness of 400 nm and in which a lower one of the gas barrier layers having the thickness of 400 nm is formed to completely cover the organic buffer layer up to end portions of the organic buffer layer and an upper one of the gas barrier layers having the thickness of 400 nm is formed over an area smaller than that of the organic buffer layer so that the end portions of the organic buffer layer can be exposed, all of the plurality of organic EL elements showed good emission states. Further, like the organic EL panel according to the present embodiment, in the case of an organic EL panel which has a gas barrier layer having a thickness of 200 nm and another gas barrier layer formed on the gas barrier layer with a thickness of 700 nm and in which a lower one of the gas barrier layers is formed to completely cover the organic buffer layer up to end portions of the organic buffer layer and an upper one of the gas barrier layers is formed over an area smaller than that of the organic buffer layer so that the end portions of the organic buffer layer can be exposed, all of the plurality of organic EL elements showed good emission states.

As a method of sealing the organic EL elements, a method of using a cap-shaped sealing substrate is known. On the other hand, the organic EL panel is demanded to be large, thin, and light. In order to meet these demands, it is difficult to realize an organic EL panel having sufficient strength against external stress because the peripheral portion and the main substrate are held by adhesive in the method of using the cap-shaped sealing substrate. In contrast, in the organic EL panel according to the present embodiment, the plurality of organic EL elements P1 are sealed over a large area by means of the so-called thin film sealing method. Accordingly, the strength of the panel is very high, it is difficult for the gas barrier layer to crack or be peeled off; and the sealing reliability with respect to the plurality of organic EL elements P1 is sufficiently high. As a result, according to the organic EL panel, it is possible to meet the above demands for the large, thin, and light organic EL panel. Further, as the organic EL panel becomes large, numbers of TFTs and wiring lines between the organic EL elements and the main substrate increase. As a result, in the case of a bottom-emission-type organic EL panel in which light from an organic light-emitting layer is emitted from the main substrate side, the aperture ratio of a pixel is reduced, which may cause the emission efficiency to be lowered. However, since the organic EL panel according to the present embodiment is of a top emission type, there is no possibility that the emission efficiency will be lowered.

When manufacturing the organic EL panel, it is preferable to perform a process under a high vacuum condition of 1 Pa or less in order to prevent adhesion of contamination, such as dust, or moisture. However, since the organic buffer layer material is of a liquid type, it is difficult to form the organic buffer layer 19 under the high vacuum condition. Therefore, in the present embodiment, the organic buffer layer 19 is formed using a screen printing method in a low-pressure atmosphere of 100 to 5000 Pa. This removes contamination and bubbles generated at the time of a coating process, contributing to removing pin holes in the gas barrier layer. In addition, the gas barrier layer is formed under a high vacuum condition of 0.1 to 10 Pa and at low temperature by means of a high-density plasma deposition method. Accordingly, the formation of the gas barrier layer is completed without damaging the plurality of organic EL elements P1. In addition, as is apparent from the above-described manufacturing process, the sealing process of the organic EL panel is not affected by the contamination that cannot be blocked even in a clean room. This is a ver, advantageous feature of the invention, as compared with actual circumstances in which it is difficult to perform a washing process until the sealing process is completed once a process of forming the organic buffer layer starts.

B: Second Embodiment

An organic EL panel according to a second embodiment of the invention is a full-color panel that uses a low-molecular-weight-based organic EL material to be described later. In the organic EL panel, full-color display is performed by using a color filter and an organic EL element that emits white light. In addition, the organic EL panel is a top-emission-type panel in which light from an organic EL element is emitted from a side opposite to a main substrate.

B1: Configuration

Figure 3:
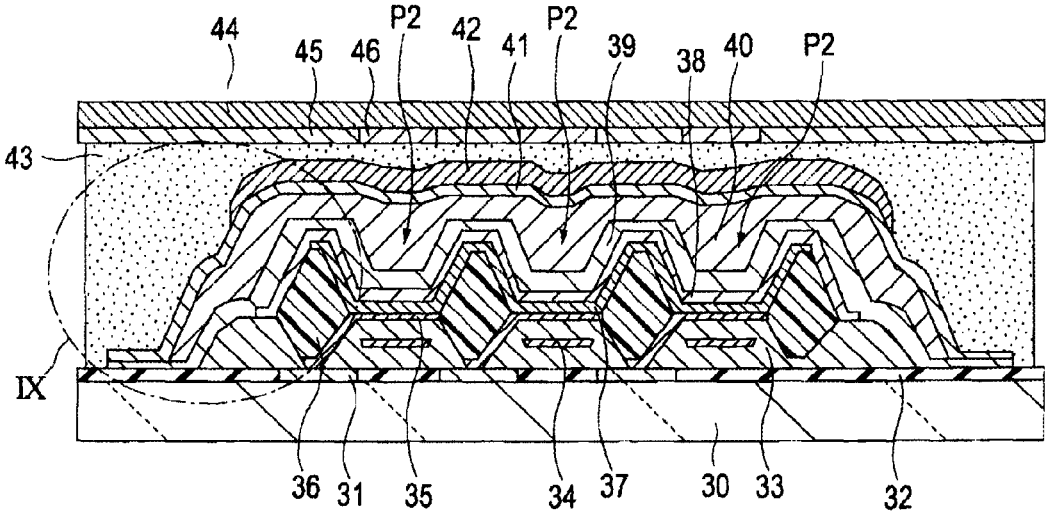
FIG. 3 is a cross-sectional view illustrating an organic EL panel according to a second embodiment of the invention.
Figure 4:
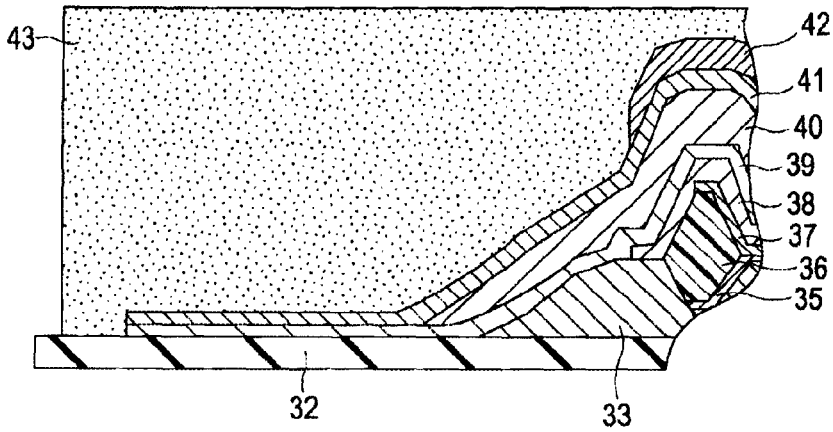
FIG. 4 is an enlarged cross-sectional view illustrating a part B shown in FIG. 3.

FIG. 3 is a cross-sectional view illustrating the organic EL panel, and FIG. 4 is an enlarged cross-sectional view illustrating a part B of the organic EL panel. A main substrate 30 is formed of glass or plastic, and a plurality of organic EL elements P2 are formed on the main substrate 30. The organic EL element P2 is an element that emits white light, has an organic light-emitting layer 37 formed of a low-molecular-weight-based organic EL material, which will be described later, and is supplied with electrical energy so that light can be emitted from the organic light-emitting layer 37 (specifically, a light-emitting layer within the organic light-emitting layer 37).

Further, a plurality of TFTs 31, which correspond to the plurality of organic EL elements P2 in one-to-one manner, and various wiring lines (not shown) are formed on the main substrate 30. In the same manner as the TFTs 11 in the first embodiment, the TFTs 31 drive the corresponding organic EL elements P2. In addition, the inorganic insulating layer 32 that covers the plurality of TFTs 31 is formed on the main substrate 30. The inorganic insulating layer 32 is provided to insulate the plurality of TFTs 31 and various wiring lines from one another and is formed of, for example, silicon nitride.

Furthermore, a planarizing layer 33 is formed on the inorganic insulating layer 32. The planarizing layer 33 is provided to make optical paths from light-emitting layers equal to one another by removing the step difference due to wiring lines or TFTs and is formed of an organic compound, such as polyimide or acrylic resin. An upper surface of the planarizing layer 33 has unevenness. Protruding portions have flat upper surfaces and overlap the plurality of organic EL elements P2. Recessed portions overlap the plurality of TFTs 31. Within the planarizing layer 33, a metal reflection layer 34 that reflects light incident from the organic EL elements P2 through anodes 35 is formed of a light-reflective metal.

On the planarizing layer 33, a pixel partition wall insulation layer 36 that goes up from the recessed portions of the planarizing layer 33 is formed of an organic compound, such as polyimide or acryl. An upper end of the pixel partition wall insulation layer 36 is positioned to be higher than the protruding portions of the planarizing layer 33, and the planarizing layer 33 and the pixel partition wall insulation layer 36 define the recessed portions. Portions, in which the pixel partition wall insulation layer 36 does not exist and the anodes 35 are in contact with the organic light-emitting layer 37, become the organic EL elements P2.

The organic EL elements P2 have the plurality of anodes 35 and a common cathode layer 38 with the organic light-emitting layer 37 interposed therebetween. The anodes 35 and the common cathode layer 38 serve as electrodes through which holes and electrons are injected into the organic light-emitting layer 37. The anode 35 is a transparent electrode that is formed on the planarizing layer 33 and is formed of, for example, ITO which has high work function and into which holes can be easily injected, and the anode 35 is connected to the corresponding TFT 31 through a gap between the planarizing layer 33 and the pixel partition wall insulation layer 36. The common cathode layer 38 is formed on the organic light-emitting layer 37 and the pixel partition wall insulation layer 36 and serves as a common electrode with respect to the plurality of organic EL elements P2. For example, the common cathode layer 38 has an electron injection buffer layer, which is provided to make electrons easily injected into the organic light-emitting layer 37, and a low-resistance layer, such as a transparent ITO layer formed on the electron injection layer or an aluminum layer that is formed on a non-pixel region. The electron injection buffer layer is formed of, for example, lithium fluoride or magnesium-silver alloy.

The organic light-emitting layer 37 corresponds to the organic light-emitting layer 16 in the first embodiment. The difference between the organic light-emitting layer 37 and the organic light-emitting layer 16 is that the organic light-emitting layer 37 is common to the plurality of organic light-emitting layers 37 and is formed of a low-molecular-weight-based organic EL material. The low-molecular-weight-based organic EL material is an organic compound having a relatively low molecular weight, among organic compounds that emit light by excitation due to recombination of holes and electrons. For example, the low-molecular-weight-based organic EL material includes a material obtained by doping anthracene-based impurities into styrylamine-base host or a material obtained by doping rubrene-based impurities into styrylamine-base host. When the organic light-emitting layer 37 includes an additional layer contributing to the recombination in the light-emitting layer, a material of the additional layer is determined according to a material of a layer adjacent to the additional layer. For example, a material of the hole injection layer includes triallylamine (ATP) polymer, a material of the hole transport layer includes triphenyl diamine (TPD) based compound, and a material of the electron injection layer includes aluminum quinolinol complex.

Furthermore, a cathode protection layer 39 that covers the common cathode layer 38 and the planarizing layer 33 is formed on the inorganic insulating layer 32 and the common cathode layer 38. In addition, an organic buffer layer 40 is formed on the cathode protection layer 39 so as to completely cover the plurality of organic EL elements P2, the pixel partition wall insulation layer 36, the planarizing layer 33. In addition, a first gas barrier layer 41, which completely covers the organic buffer layer 40 up to end portions of the organic buffer layer 40, is formed on the cathode protection layer 39 and the organic buffer layer 40. On the first gas barrier layer 41, a second gas barrier layer 42 is formed so as to cover the entire plurality of organic EL elements P2 and to cover a region smaller than the organic buffer layer 40 so that the end portions of the organic buffer layer 40 can be exposed.

The cathode protection layer 39, the organic buffer layer 40, the first gas barrier layer 41, and the second gas barrier layer 42 correspond to the cathode protection layer 18, the organic buffer layer 19, the first gas barrier layer 20, and the second gas barrier layer 21, respectively. Even though parts of the organic buffer layer 40, the first gas barrier layer 41, and the second gas barrier layer 42 overlapping the entire plurality of organic EL elements P2 are flat, the flatness is lower than that in the first embodiment. This is because the thickness of the organic buffer layer 40 is 3 to 5 μm, the thickness is not sufficient to realize the same flatness as in the first embodiment. However, unevenness of the upper surface of the organic buffer layer 40 is 0.5 μm or less, and an uneven level of upper surface of the organic buffer layer 40 is extremely smaller than that of the upper surface of the common cathode layer 38. Further, when a screen printing method used to form the organic buffer layer 40 is used, it is possible to make the uneven level of the upper surface of the organic buffer layer 40 smaller by making planarization control using a screen mesh and a squeegee.

Furthermore, on the main substrate 30, an adhesion layer 43 is formed to cover the inorganic insulating layer 32, the cathode protection layer 39, the first gas barrier layer 41, and the second gas barrier layer 42. In addition, a color filter substrate 44 is provided on the adhesion layer 43 so as to completely cover the adhesion layer 43. The entire lower surface of the color filter substrate 44 is adjacent to the adhesion layer 43. The adhesion layer 43 is provided for adhesion between the color filter substrate 44 and the main substrate 30 and is formed of resin adhesive having excellent light transmittance. The resin adhesive includes epoxy resin, acrylic resin, urethane resin, silicon resin, or the like. The adhesion layer 43 may be composed of two kinds of different adhesives. In this case, preferably, an ultraviolet-setting adhesive is used in a peripheral region, and a thermosetting adhesive is used in an emission surface located at a central portion. Further, it is essential to precisely control the position of the color filter substrate and the thickness of the adhesive. Since the ultraviolet-setting adhesive can be cured for only a few seconds without position deviation, the position control or the thickness control can be easily made.

The color filter substrate 44 is provided to extract red-colored, green-colored, and blue-colored light components from light emitted from the organic EL elements P2 and includes a black matrix layer 45 having low light transmittance and filter layers 46 that cover openings formed in the black matrix layer 45. The black matrix layer 45 has a plurality of openings. In addition, three kinds of filter layers 46, which include a filter layer through which only red-colored light is transmitted, a filter layer through which only green-colored light is transmitted, and a filter layer through which only blue-colored light is transmitted. Each of the filter layers 46 overlaps the organic EL elements P2. The red-colored, green-colored, and blue-colored light components of the light emitted from the organic EL elements P2 overlapping the filter layers 46 are transmitted through the corresponding filter layers 46, respectively. Furthermore, since the color filter substrate 44 serves to protect a gas barrier layer, a portion other than the black matrix layer 45 and the filter layers 46 is formed of glass or plastic having excellent light transmittance. The plastic includes polyethyleneterephthalate, acrylic resin, polycarbonate, polyolefin, or the like. In addition, the color filter substrate 44 may have a function of blocking/absorbing ultraviolet rays, a function of preventing reflection of external light, or a function of heat dissipation.

B2: Manufacturing Process

In order to manufacture the organic EL panel according to the present embodiment, first, the TFTs 31, various wiring lines, and the inorganic insulating layer 32 are firmed on the main substrate 30. Then, the planarizing layer 33 and the metal reflection layer 34 are formed on the inorganic insulating layer 32. Then, in order to prevent electrical corrosion of the metal reflection layer 34, a surface and a peripheral portion of the metal reflection layer 34 are coated with an inorganic insulating layer, and then the plurality of anodes 35 are formed. Thus, the TFTs 31 and the anodes 35 are connected to each other in one-to-one manner. As a method of forming the anodes, it is possible to use one of the known methods suitable for a material of the anodes 35. Then, the pixel partition wall insulation layer 36 is formed on parts of the anodes 35 and the planarizing layer 33 by means of pattern formation of polyimide, for example. Then, a washing process, such as a plasma washing, is performed to remove organic contamination from the main substrate 30 or to increase the work function.

Thereafter, on the anodes 35 that are exposed, the organic light-emitting layer 37 common to the plurality of organic EL elements P2 is formed. In this process, a light-emitting layer is formed with a low-molecular-weight-based organic EL material. The process of forming the organic light-emitting layer 37 is performed using a vacuum deposition method using a heating boat. The vacuum deposition method can also be applied to a case in which the organic light-emitting layer 37 includes only a light-emitting layer or a case in which the organic light-emitting layer 37 includes a plurality of layers. In the case when the organic light-emitting layer 37 includes the plurality of layers, the plurality of layers are sequentially formed.

Then, an electrode common to the plurality of organic EL elements P2, that is, the common cathode layer 38 is formed. Then, an oxygen plasma process is performed, and then the cathode protection layer 39 is formed to cover the common cathode layer 38. Then, the organic buffer layer 40 is formed on the cathode protection layer 39 by using a screen printing method in a low-pressure atmosphere. Then, an oxygen plasma process is performed and then the first gas barrier layer 41 is formed over an area larger than that of the organic buffer layer 40 so as to cover the entire organic buffer layer 40. Then, on the first gas barrier layer 41, a second gas barrier layer 42 is formed so as to overlap the entire plurality of organic EL elements P2 and to cover a region smaller than the organic buffer layer 40 so that the end portions of the organic buffer layer 40 can be exposed. Materials or methods of forming the organic buffer layer 40, the first gas barrier layer 41, and the second gas barrier layer 42 are the same as described in the first embodiment.

Subsequently, a resin adhesive having excellent light transmittance is coated to cover the inorganic insulating layer 32, the cathode protection layer 39, the first gas barrier layer 41, and the second gas barrier layer 42, the entire lower surface of the color filter substrate 44 comes in contact with the resin adhesive, and the resin adhesive is cured, thereby forming the adhesion layer 43. This curing is performed at the locations at which the plurality of filters 46 of the color filter substrate 44 overlap the plurality of organic EL elements P2 in one-to-one manner. In addition, the alternative of adhesion of the surface protection substrate 23 in the first embodiment can also be applied as alternative of adhesion of the color filter substrate 44.

B3: Effects

In the organic EL panel according to the present embodiment, it is possible to obtain the same effects as obtained in the organic EL panel according to the first embodiment.

C: Modifications

In a modification of the above-described embodiment, it is possible to use a panel that emits single colored light or a full-color panel having a color conversion layer. Alternatively, a bottom-emission-type panel may be used. In this case, the requirement of high light transmittance is limited to layers located below the light-emitting layer. Accordingly, when the common cathode layer is located above the light-emitting layer, the common cathode layer may be formed thick over the entire surface of a substrate by using a metal material, such as low-resistance aluminum.

In another modification of the above-described embodiment, the second gas barrier layer may be located below the first gas barrier layer, or the second gas barrier layer may be located within the organic buffer layer. Further, the number of gas barrier layers may be 3 or more. At this time, these gas barrier layers should include at least one gas barrier layer that is formed over an area smaller than that of the organic buffer layer so that end portions of the organic buffer layer can be exposed.

In still another modification of the above-described embodiment, only one gas barrier layer may be provided. At this time, the gas barrier layer should be formed such that the organic buffer layer is covered and a portion completely overlapping the plurality of organic EL elements is thicker than other portions that cover the end portions of the organic buffer layer. A method of forming the gas barrier layer can be arbitrarily selected. For example, the gas barrier layer may be formed by using a deposition source disposed to be close to the center of the plurality of organic EL elements, or the gas barrier layer may be formed by forming a gas barrier layer having uniform thickness and then etching portions not overlapping the organic EL elements such that the portions not overlapping the organic EL elements become thin.

D: Electronic Apparatus

The above-mentioned organic EL panel can be applied to various electronic apparatuses. In the invention, the organic EL panel is applied to an image display apparatus and an image printing apparatus.

D1: Image Display Apparatus

An image display apparatus having the organic EL panel includes wiring lines for supplying electric energy and control signals to the organic EL panel and a circuit for generating control signals allowing an optical image to be formed on the organic EL panel on the basis of image data supplied from an external device. Various types of image display apparatuses can be used, but in the invention, two types of image display apparatuses are exemplified.

Figure 5:
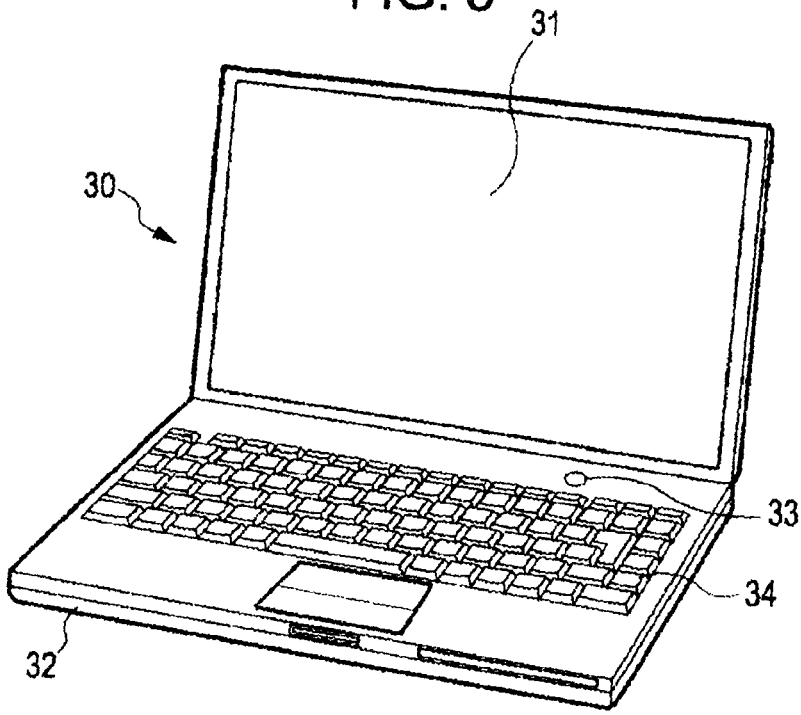
FIG. 5 is a view illustrating a personal computer using the organic EL panel according to the embodiment of the invention.

FIG. 5 shows the structure of a personal computer using the above-mentioned organic EL panel as a display unit 31. A personal computer 30 includes a display unit 31, serving as a display device, and a main body 32. The main body 32 is provided with a power switch 33 and a keyboard 34. Since the personal computer 30 uses the above-mentioned organic EL panel as the display unit 31, it is possible to meet demands for an increase in the size of the display unit 31 and a reduction in the thickness and weight of the display device 31. In addition, since the quality of light emitted from the organic EL panel is hardly deteriorated, it is easy to keep display quality for a long time.

Figure 6:
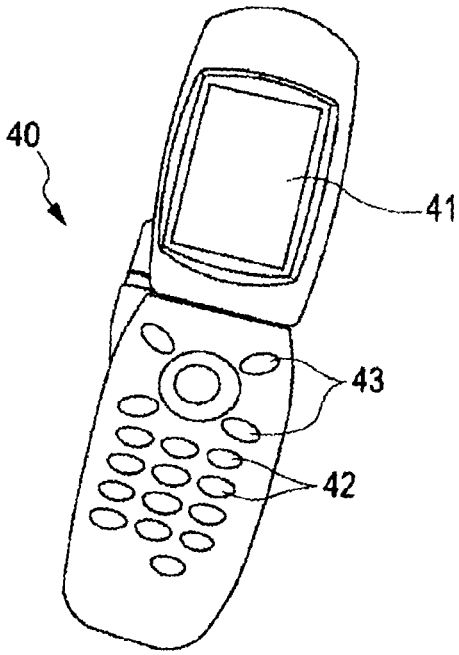
FIG. 6 is a view illustrating a mobile phone using the organic EL panel according to the embodiment of the invention.

FIG. 6 shows the structure of a mobile phone using the above-mentioned organic EL panel as a display unit 41. A mobile phone 40 includes a plurality of operating buttons 42, a plurality of scroll buttons 43, and the display unit 41 serving as a display device. The scroll button 43 is operated to scroll a screen displayed on the display unit 41. Since the mobile phone 40 uses the above-mentioned organic EL panel as the display unit 41, it is possible to meet demands for a reduction in the thickness and weight of the display device 41. In addition, since the quality of light emitted from the organic EL panel is hardly deteriorated, it is easy to keep display quality for a long time.

D2: Image Printing Apparatus

Next, an image printing apparatus using the above-mentioned organic EL panel will be described. This type of image printing apparatus includes a printer, a printing unit of a copy machine, and a printing unit of a facsimile. The above-mentioned organic EL panel can be applied to various types of image printing apparatuses. However, in the invention, two types of electrophotographic full color image printing apparatuses are used as examples of the image printing apparatus.

Figure 7:
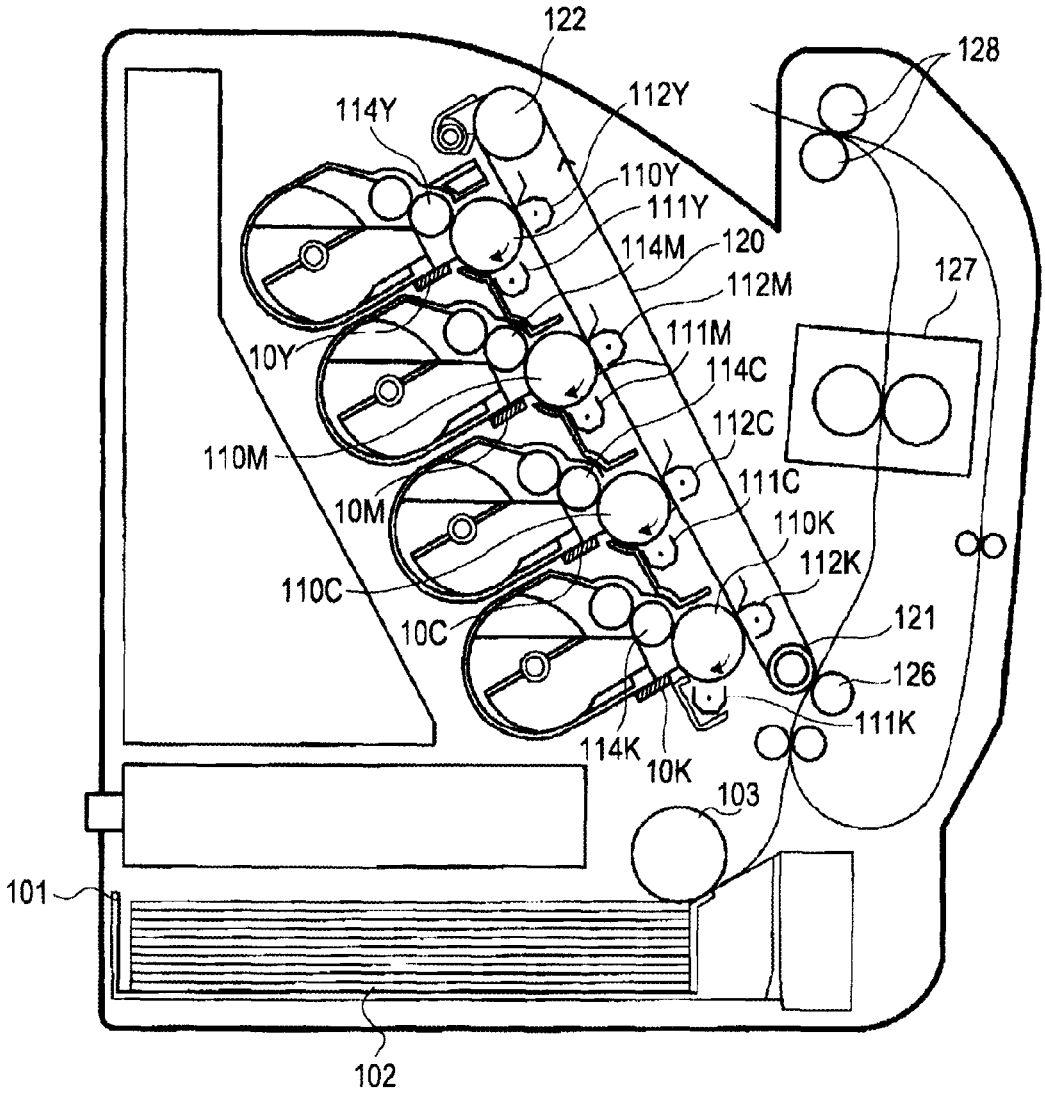
FIG. 7 is a longitudinal sectional view illustrating an example of an image printing apparatus using the organic EL panel according to the embodiment of the invention.

FIG. 7 is a longitudinal sectional view showing an example of an image printing apparatus using the above-described organic EL panels as line-type exposure heads. The image printing apparatus is a tandem-type full-color image printing apparatus using a belt intermediate transfer method. In the image printing apparatus, four exposure heads 10K, 10C, 10M, and 10Y having the same configuration are arranged at exposure positions of four corresponding photoconductor drums (image carriers) 110K, 110C, 110M, and 110Y having the same configuration.

As shown in FIG. 7, the image printing apparatus is provided with a driving roller 121 and a driven roller 122, and an endless intermediate transfer belt 120 is wound around these rollers 121 and 122 so as to rotate around the rollers 121 and 122 in a direction indicated by arrow. Although not shown in FIG. 7, the image printing apparatus may be provided with a tension applying member, such as a tension roller, that applies tension to the intermediate transfer belt 120.

The four photoconductor drums 110K, 110C, 110M, and 110Y each having a photosensitive layer on its outer peripheral surface are arranged at predetermined intervals from each other around the intermediate transfer belt 120. The suffixes K, C, M, and Y mean black, cyan, magenta, and yellow used for forming corresponding toner images, respectively. This is similarly applied to other members. The photoconductor drums 110K, 110C, 110M, and 110Y are driven to rotate in synchronization with the driving of the intermediate transfer belt 120.

A corona charging device 111 (K, C, M, and Y), the exposure head 10 (K, C, M, and Y), and a developing device 114 (K, C, M, and Y) are arranged around each photoconductor drum 110 (K, C, M, and Y). The corona charging device 111 (K, C, M, and Y) uniformly charges the outer peripheral surface of the corresponding photoconductor drum 110 (K, C, M, and Y). The exposure head 10 (K, C7, M, and Y) writes an electrostatic latent image on the charged outer peripheral surface of the photoconductor drum. The exposure heads 10 (K, C, M, or Y) are arranged such that a plurality of organic EL elements are aligned along the generatrix (main scanning direction) of each of the photoconductor drums 110 (K, C, M, or Y). The writing of an electrostatic latent image is performed by illuminating light emitted from the plurality of organic EL elements onto the photoconductor drums with. The developing device 114 (K, C, M, and Y) deposits toner, serving as a developing agent, on the electrostatic latent image, thereby forming a toner image, i.e., a visible image on the corresponding photoconductor drum.

The black, cyan, magenta, and yellow toner images formed by the four single-color toner image forming stations are primarily transferred onto the intermediate transfer belt 120 sequentially so as to be superposed onto one another on the intermediate transfer belt 120. As a result, a full-color toner image is obtained. Four primary transfer corotrons (transferring device) 112 (K, C, M, and Y) are arranged inside the intermediate transfer belt 120. The primary transfer corotrons 1112 (K, C, M, and Y) are arranged in the vicinities of the photoconductor drums 110 (K, C, M, and Y), respectively, and electrostatically attract the toner images from the photoconductor drums 110 (K, C, M, and Y) to transfer the toner images onto the intermediate transfer belt 120 passing between the photoconductor drums and the primary transfer corotrons.

A sheet 102 as a target on which an image is to be finally formed is fed one by one from a sheet feed cassette 101 by a pickup roller 103, and is then sent to a nip between the intermediate transfer belt 120 abutting on the driving roller 121 and a secondary transfer roller 126. The full-color toner images on the intermediate transfer belt 120 are secondarily transferred onto one side of the sheet 102 collectively by the secondary transfer roller 126, and then the transferred image passes between a pair of fixing rollers 127, serving as a fixing unit, to be fixed on the sheet 102. Thereafter, the sheet 102 is discharged to a sheet discharge cassette that is formed on the top of the image printing apparatus, by a pair of sheet discharge rollers 128.

According to the above-described image printing apparatus, since the above-mentioned organic EL panels are used as the exposure heads 10 (K, C, M and Y), it is possible to meet demands for a reduction in the size of the exposure head. In addition, since the quality of light emitted from the organic EL panel is hardly deteriorated, it is easy to keep display quality for a long time.

Figure 8:
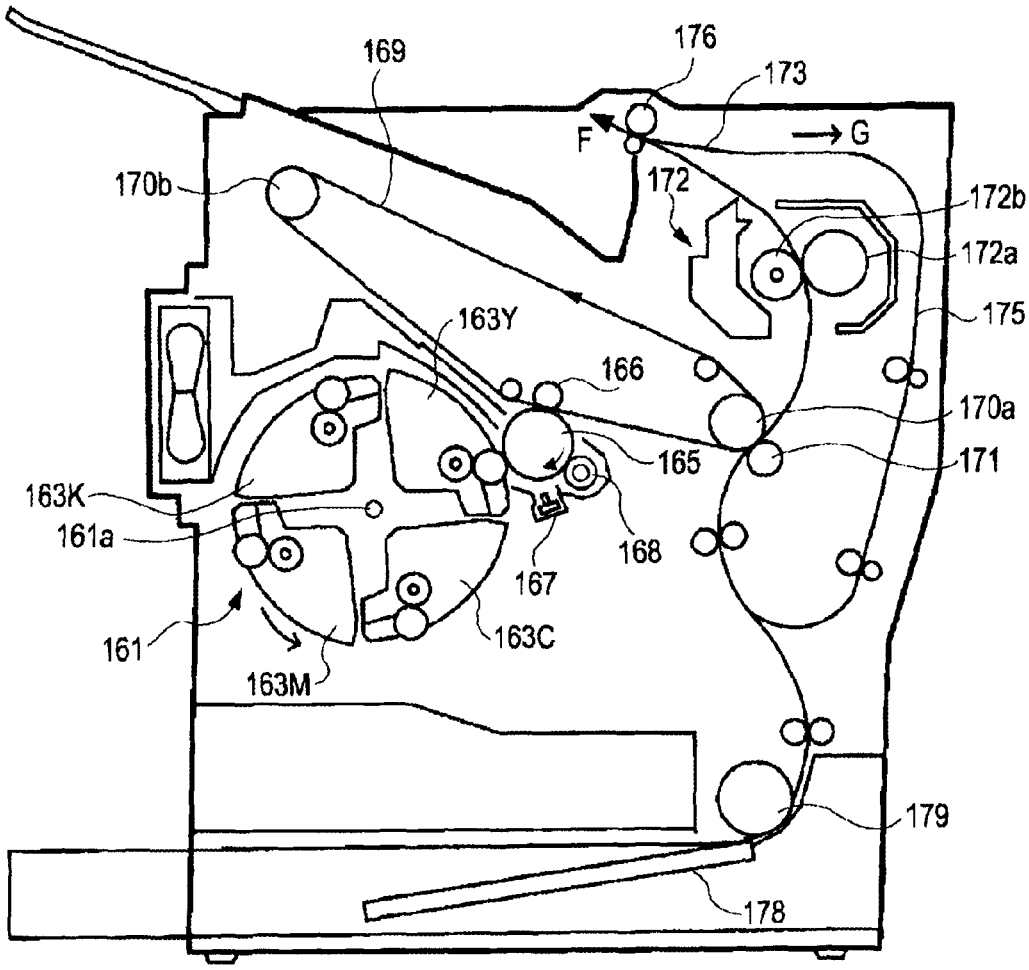
FIG. 8 is a longitudinal sectional view illustrating another example of the image printing apparatus using the organic EL panel according to the embodiment of the invention.

FIG. 8 is a longitudinal sectional view showing another image printing apparatus using the above-mentioned EL panel as a line-type exposure head. The image printing apparatus is a rotary-development-type full-color image printing apparatus using a belt intermediate transfer method.

In the image printing apparatus shown in FIG. 8, a corona charging device 168, a rotary developing unit 161, an exposure head 167, and an intermediate transfer belt 169 are provided around a photoconductor drum (image carrier) 165.

The corona charging device 168 uniformly charges the outer peripheral surface of the photoconductor drum 165. The exposure head 167 writes an electrostatic latent image on the charged outer peripheral surface of the photosensitive drum 165. The exposure head 167, which is the above-mentioned organic EL panel, is arranged such that a plurality of organic EL elements are aligned along the generatrix (main scanning direction) of the photoconductor drum 165. The writing of an electrostatic latent image is performed by illuminating light emitted from the plurality of EL elements onto the photoconductor drum.

The developing unit 161 is a drum having four developing devices 163Y, 163C, 163M, and 163K arranged at angular intervals of 90°, and is rotatable around a shaft 161a in the counterclockwise direction. The developing devices 163Y, 163C, 163M, and 163K respectively supply yellow, cyan, magenta, and black toners to the photoconductor drum 165 to deposit the toners as developing agents on an electrostatic latent image, thereby forming a toner image, i.e., a visible image on the photosensitive drum 165.

The endless intermediate transfer belt 169 is wound around a driving roller 170a, a driven roller 170b, a primary transfer roller 166, and a tension roller, and rotates around these rollers in a direction indicated by arrow. The primary transfer roller 166 electrostatically attracts the toner image from the photoconductor drum 165 and transfers the toner image to the intermediate transfer belt 169 passing between this photoconductor drum and the primary transfer roller 166.

More specifically, during the first one turn of the photoconductor drum 165, an electrostatic latent image for a yellow (Y) image is written by the exposure head 167, a toner image with the same color is formed by the developing device 163Y, and the toner image is then transferred onto the intermediate transfer belt 169. During the next turn of the photoconductor drum, an electrostatic latent image for a cyan (C) image is written by the exposure head 167, a toner image with the same color is formed by the developing device 163C, and the toner image is then transferred onto the intermediate transfer belt 169 so as to be superposed on the yellow toner image. While the photoconductor drum 165 makes four turns in this way, yellow, cyan, magenta, and black toner images are sequentially superposed on the intermediate transfer belt 169. As a result, a full-color toner image is formed on the intermediate transfer belt 169. When images are formed on both sides of a sheet on which the images are to be finally formed, a full-color toner image is formed on the intermediate transfer belt 169 in such a manner that toner images with the same color are transferred onto the front and rear surfaces of the intermediate transfer belt 169, and then toner images with the next same color are transferred onto the front and rear surfaces of the intermediate transfer belt 169.

A sheet conveying path 174 is formed in the image printing apparatus to allow a sheet to pass therethrough. A sheet is picked up one by one from a sheet feed cassette 178 by a pickup roller 179, is conveyed by a conveying roller along the sheet conveying path 174, and passes through a nip between the intermediate transfer belt 169 abutting on the driving roller 170a and the secondary transfer roller 171. The secondary transfer roller 171 electrostatically attracts a full-color toner image collectively from the intermediate transfer belt 169 to transfer the toner image onto one surface of the sheet. The secondary transfer roller 171 is adapted to approach and be separated from the intermediate transfer belt 169 by a clutch (not shown). When a full-color image is transferred onto a sheet, the secondary transfer roller 171 is brought into contact with the intermediate transfer belt 169. When a toner image is superposed on the intermediate transfer belt 169, the secondary transfer roller 171 is separated from the intermediate transfer belt 169.

The sheet having the toner image transferred thereonto in this manner is conveyed to the fixing unit 172, and then passes between a heating roller 172a and a pressure roller 172b of the fixing unit 172, so that the toner image is fixed to the sheet. The sheet after the fixing process passes through a pair of sheet discharge rollers 176 to advance in a direction indicated by an arrow F. In a case of double-sided printing, after most of the sheet has passed between the pair of sheet discharge rollers 176, the pair of sheet discharge rollers 176 are rotated in a reverse direction so that the sheet is introduced into a conveying path 175 for double-sided printing, as indicated by an arrow G. Then, the toner image is transferred onto the other surface of the sheet by the secondary transfer roller 171 and the fixing unit 172 performs the fixing process on the toner image again. Then, the sheet is discharged by the pair of sheet discharge rollers 176.

Since the above-mentioned image printing apparatus uses the above-mentioned organic EL panel as the exposure head 167, it is possible to meet demands for a reduction in the size of the exposure head. In addition, since the quality of light emitted from the organic EL panel is hardly deteriorated, it is easy to keep display quality for a long time.

Although the image printing apparatus has been described as an example of the electronic apparatus including the organic EL device according to the invention, the organic EL device according to the invention can also be applied to other electrophotographic image printing apparatuses, such as an image printing apparatus that directly transfers a toner image onto a sheet from a photoconductor drum without using an intermediate transfer belt, an image printing apparatus that forms a monochromatic image, and an image printing apparatus that uses a photoconductor belt as an image carrier.

What is claimed is:

1. A light-emitting device, comprising:

a substrate;

an insulating layer formed of an inorganic compound and having an upper surface, the insulating layer formed on the substrate;

a plurality of light-emitting elements formed in a region over the insulating layer, each of the light-emitting elements having an anode, a thin organic light-emitting layer, and a cathode sequentially stacked above the insulating layer, the cathode of at least one of the light emitting elements having an upper surface defining a step, the light-emitting elements emitting light by excitation due to an electric field;

an insulating pixel partition wall separating the anodes of at least two of the light-emitting elements;

an organic buffer layer having outer and inner surfaces, the organic buffer layer being formed of an organic compound and covering an area that is larger than the region in which the light-emitting elements are formed, the inner surface of the organic buffer layer filling the step of the upper surface of the cathode such that the outer surface of the organic buffer layer is substantially flat; and first and second gas barrier layers, formed of an inorganic compound, disposed on the outer surface of the organic buffer layer, and shielding the plurality of light-emitting elements from an environment external to the device, only one of the first and second gas barrier layers covering an area larger than the organic buffer layer.

2. The light-emitting device according to claim 1, further comprising:

a cathode protection layer that is provided between the cathode and the organic buffer layer and is formed of an inorganic compound.

3. The light-emitting device according to claim 1, the first gas barrier layer covering an area larger than the organic buffer layer, and the second gas barrier layer covering an area that is smaller than the organic buffer layer and larger than the region where the light-emitting elements are formed.

4. The light-emitting device according to claim 1, the second gas barrier layer being thicker than the first gas barrier layer.

5. An electronic apparatus, comprising:

the light-emitting device according to claim 1.

6. A light-emitting device, comprising:

a substrate;

an insulating layer on the substrate;

a plurality of light-emitting elements formed in a region over the substrate, each of the light-emitting elements having an anode, a thin organic light-emitting layer, and a cathode sequentially stacked above the insulating layer, the cathode of at least one of the light-emitting elements having an upper surface defining a step, the light-emitting elements emitting light by excitation due to an electric field;

an insulating pixel partition wall separating the anodes of at least two of the of light-emitting elements;

an organic buffer layer having outer and inner surfaces, the organic buffer layer being formed of an organic compound and covering an area that is larger than the region in which the light-emitting elements are formed, the inner surface of the organic buffer layer filling the step of the upper surface of the cathode such that the outer surface of the organic buffer layer is substantially flat, the organic buffer layer having end portions; and a gas barrier layer formed of an inorganic compound and covering the organic buffer layer in order to protect the plurality of light-emitting elements from an environment external to the device, the gas barrier layer having a first portion and a peripheral portion, the first portion covering the region where the plurality of light-emitting elements are formed and being thicker than the peripheral portion, the peripheral portion covering the end portions of the organic buffer layer.

7. The light-emitting device according to claim 6, wherein the insulating layer has an upper surface, the light-emitting device further comprising:

in the end portions of the organic buffer layer, an angle between the outer surface of the organic buffer layer and the upper surface of the insulating layer on the substrate being 20° or less, the insulating layer being formed of an inorganic compound.

*8. A light-emitting device, comprising:*

*a substrate having a light-emitting region;*

*a light-emitting element disposed above the substrate in the light-emitting region, the light-emitting element having a first electrode, a second electrode, and a light-emitting layer disposed between the first electrode and the second electrode;*

*an organic buffer layer disposed over the light-emitting element and being formed of an organic compound, a region of forming of the organic buffer layer being larger than the light-emitting region;*

*a first gas barrier layer disposed over the organic buffer layer and being formed of an inorganic compound, a region of forming of the first gas barrier layer being larger than the region of forming of the organic buffer layer; and*

*a second gas barrier layer disposed on the first gas barrier layer and formed of an inorganic compound, a region of forming of the second gas barrier layer being smaller than the region of forming of the organic buffer layer.*

*9. A light-emitting device, comprising:*

*a substrate having a light-emitting region;*

*a light-emitting element disposed above the substrate in the light-emitting region, the light-emitting element having a first electrode, a second electrode, and a light-emitting layer disposed between the first electrode and the second electrode;*

*an organic buffer layer disposed over the light-emitting element and being formed of an organic compound, a region of forming of the organic buffer layer being larger than the light-emitting region; and*

*a gas barrier layer disposed over the organic buffer layer and being formed of an inorganic compound, a region of forming of the gas barrier layer being larger than the region of forming of the organic buffer layer, the gas barrier layer having a first portion covering the light-emitting region and a second portion covering an edge portion of the organic buffer layer, the thickness of the first portion is larger than the thickness of the second portion.*

* * * * *